United States Patent

[11] 3,605,063

[72] Inventor Marvin C. Stewart
88 Harriman St., Hempstead, N.Y. 11550
[21] Appl. No. 806,407
[22] Filed Mar. 12, 1969
[45] Patented Sept. 14, 1971

[54] SYSTEM FOR INTERCONNECTING ELECTRICAL COMPONENTS
17 Claims, 9 Drawing Figs.

[52] U.S. Cl. 339/18 R, 317/101 CE, 317/101 CM, 339/17 LM, 339/17 M, 339/18 B, 339/18 C
[51] Int. Cl. H01r 29/00
[50] Field of Search 339/18, 17; 317/101 CC, 101 CM, 101 CX

[56] References Cited

UNITED STATES PATENTS

| | | | |
|---|---|---|---|
| 2,226,745 | 12/1940 | Schrack | 317/101 |
| 2,353,061 | 7/1944 | Oldenboom | 339/17 X |
| 2,616,994 | 11/1952 | Luhn | 339/17 LM X |
| 2,889,532 | 6/1963 | Slack | 339/18 C |
| 3,300,686 | 1/1967 | Johnson et al. | 339/17 X |
| 3,302,067 | 1/1967 | Jackson et al. | 339/101 CM |
| 3,398,232 | 8/1968 | Hoffman | 339/18 B X |

*Primary Examiner*—Ian A. Calvert
*Assistant Examiner*—Terrell Lewis
*Attorney*—Kenyon & Kenyon Reilly Carr & Chapin

ABSTRACT: A system for interconnecting electrical components. Individual components are mounted on the edge of cards having a matrix of paired conductive pads supported thereon. EAch pair of pads is electrically connected and one pad of each pair comprises a plated through hole to the other side of the card. Conductive paths provide electrical connection between the component leads and selected pairs of pads. Interconnection between components is accomplished through wiring cards which also support a matrix of paired conductive pads with one pad of the pair comprising a plated through hole to the other side of the card. Two types of wiring cards are used, one referred to as a vertical card in which all of the pad pairs in a vertical column are interconnected by conductive paths and the other referred to as a horizontal card in which all of the pad pairs in a horizontal row are interconnected by conductive paths. Alternate cards have plated through holes which are staggered. Electrical interconnection is accomplished by forming a stack of a component card, a vertical card, a horizontal card, another vertical card and another component card, compressing the stack to make electrical contact between the pad pairs of adjacent cards. Suitable electrical paths between components is accomplished by punching holes in the wiring cards to interrupt electrical connection between the pads of a pair or between pad pairs. In this manner, electricity may be conducted either through a card to the next card by means of the plated through holes or along the surface of the card by means of the conductive paths interconnecting pad pairs.

INVENTOR.
MARVIN C. STEWART

BY Kenyon & Kenyon

ATTORNEYS

INVENTOR.
MARVIN C. STEWART
BY Kenyon & Kenyon
ATTORNEYS

INVENTOR.
MARVIN C. STEWART

BY Kenyon & Kenyon

ATTORNEYS

SYSTEM FOR INTERCONNECTING ELECTRICAL COMPONENTS

This invention relates to an electrical system for interconnecting electrical components and more particularly to such a system wherein electrical components are mounted on the edges of component cards and electrical interconnection between components is achieved by means of wiring cards sandwiched between the component cards.

In the electronics field and especially in the computer field, there has been a growing tendency to standardize the various subassemblies which comprise an electronic device such as a computer. Thus in the case of a computer, various logic and associated circuitry have been standardized into the form of printed circuit card modules. These card modules support various electrical components which are interconnected on the module by printed or etched circuitry. The modules are slidably mounted within a chassis frame which is adapted to hold several of such card modules. Interconnection between modules is accomplished by means of connectors mounted on the chassis into which the modules are plugged and round or flat cable wiring between connectors. In this manner, any desired electronic system may be built up from the standardized subassembly modules.

These printed circuit card module systems have a number of disadvantages, however. In order to offer sufficient flexibility to the system purchaser, many different types of card modules must be provided with cards carrying the same components being electrically connected in different patterns in order to provide different circuitry. This results in unnecessary duplication, inefficiency, and undue cost. Moreover, the circuitry of an individual module cannot be altered, since the components are electrically connected by printed or etched conductive paths. In addition, interconnection between card modules is accomplished either through the use of expensive automatic wiring equipment or by custom hand wiring which is expensive and time consuming. Interconnection between modules also requires the use of individual connectors for each module, further complicating the module interconnection system.

According to the present invention, a new and improved card and interconnection wiring system is provided which obviates the disadvantages of the presently known systems. In brief, the present invention comprises a stack of cards preferably the size of standard business machine or so-called "IBM" cards, wherein individual electrical components are mounted on the edge of component cards and electrical interconnection between cards is achieved through the use of wiring cards of a specific design sandwiched between the component cards. Each of the component and wiring cards are provided on one side thereof with a plurality of paired and electrically connected conductive pads which are preferably arranged in a matrix of vertical columns and horizontal rows. One pad of each pair of pads is provided with a plated through hole to the other side of the card to a similar pad on that side. On the component cards, each pad pair is electrically isolated from each other pair and conductive paths connect the leads of the component to selected pad pairs. The wiring cards are of two basic types, one (called a vertical card) in which all of the pairs in each vertical column are electrically interconnected by a conductive path, the other (called a horizontal card) in which all of the pairs in each horizontal row are electrically interconnected by a conductive path.

Prior to assembling the cards, holes are punched into the wiring cards at selected points to interrupt the electrical connection between pads of a pair or between pairs. These holes may be punched through the use of standard business keypunch machines. The component cards and wiring cards are preferably assembled in the following sequence: a component card, a vertical card, a horizontal card, a vertical card and a component card. By proper selection of the holes punched in the wiring cards, electrical connection between components is accomplished by means of the conductive paths and pad pairs on the cards and the plated holes through the cards.

It is thus an object of the present invention to provide an electrical component and interconnection system which is compact, inexpensive, easily and quickly assembled and particularly adaptable to automatic assembly techniques.

It is a further object of the present invention to provide an electrical component and interconnection system in which a stack of standard business machine cards are used for mounting individual components and for providing electrical interconnection between cards without the use of separate connectors and electrical wiring.

It is yet another object of the present invention to provide an electrical component and interconnection system in which individual systems may be changed without destruction of the cards upon which the components are mounted and consequently in which said component cards may be reused.

It is a still further object of the present invention to provide an electrical component and interconnection system in which a wide variety of components may be used, but in which the need for standardizing a large number of component arrangements is minimized.

These and other objects of the present invention will be pointed out and will be readily apparent from the following description and drawings wherein.

Figure 1:
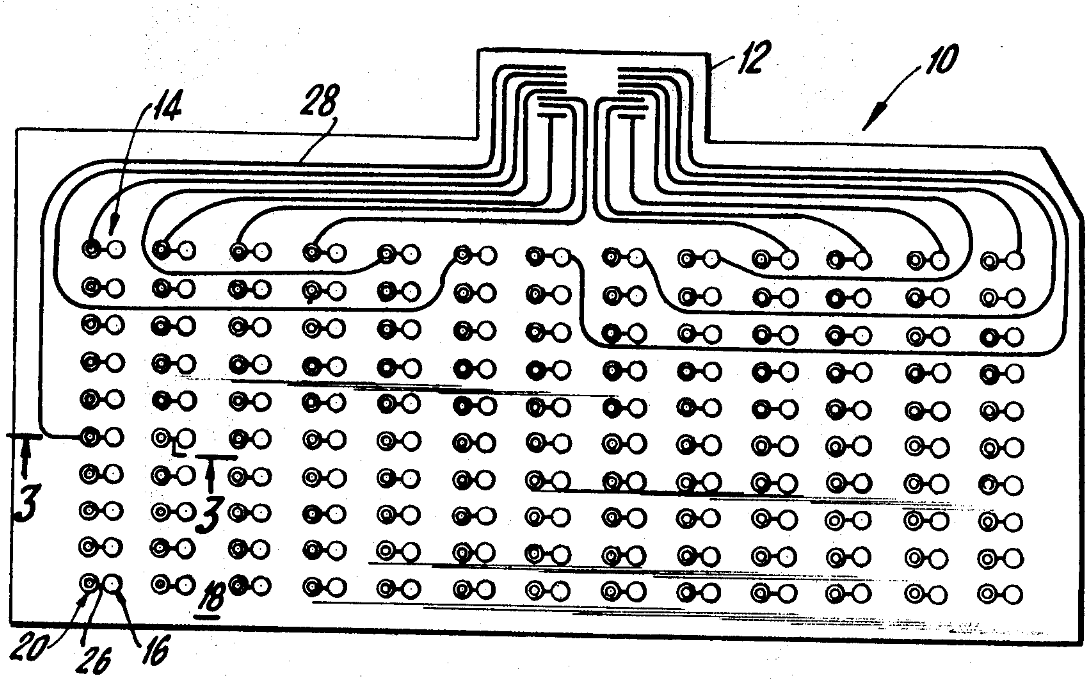
FIGS. 1 and 2 are plan views of component cards that may be used in the system of the present invention.
Figures 2, 3:
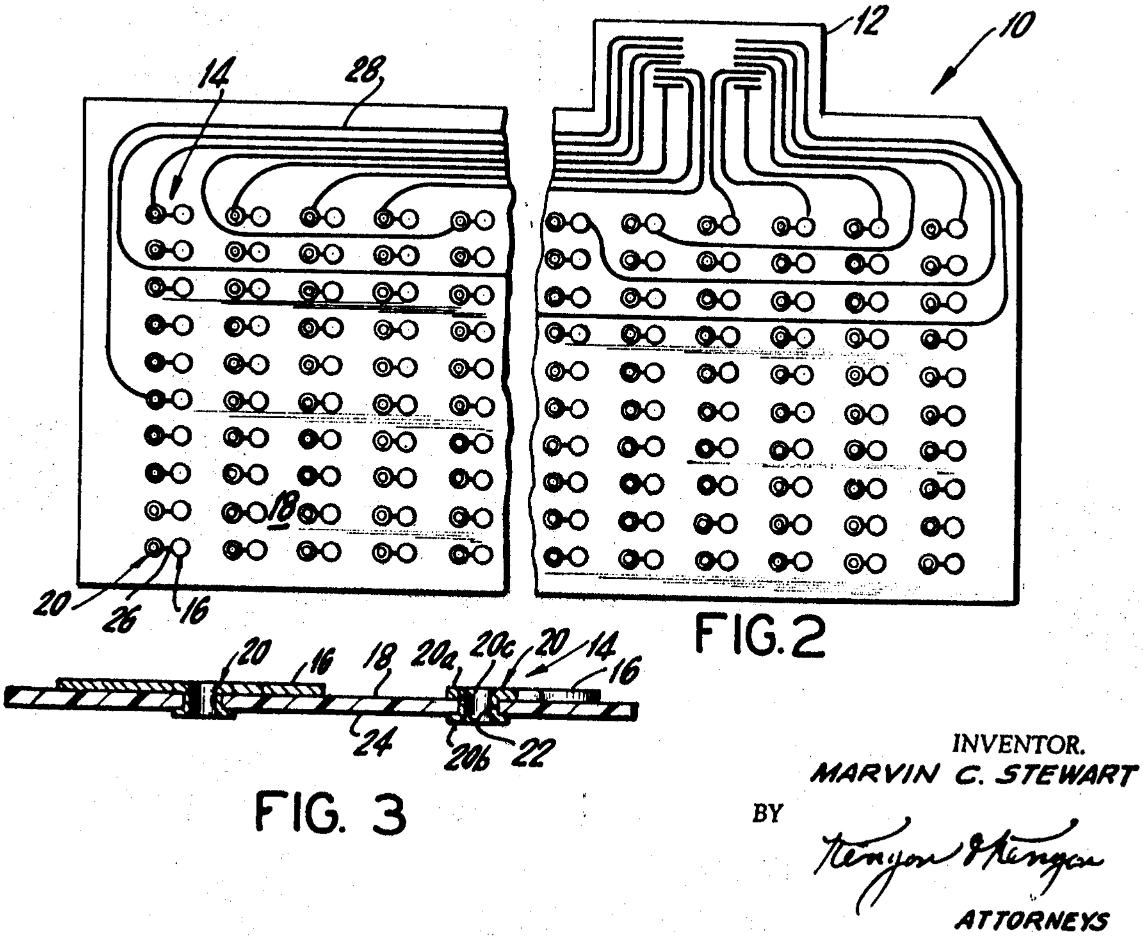
FIG. 3 is a side elevational view taken along line 3—3 of FIG. 1.

Referring now to the FIGS., a more detailed description of a preferred embodiment of the present invention will now be given. Referring specifically to FIGS. 1, 2, and 3, there are shown component cards 10, which may be used in the system of the present invention. The card shown in FIG. 2 is but a slight modification of the card shown in FIG. 1, and therefore the description given hereinbelow is equally applicable to both embodiments. Card 10 is of any suitable insulating material and may be of any specified dimensions. However, in order to take advantage of standard business machine equipment, it is preferable that card 10 be of the same dimensions as a standard business machine card or so-called "IBM" card. Thus card 10 will generally comprise card stock material. As shown, card 10 is generally rectangular in shape and has a protruding portion 12 for mounting individual electronic components.

Card 10 is provided with a plurality of conductive pads arranged in pairs 14 which are arranged in a matrix of vertical columns and horizontal rows. Each pair 14 comprises a pad 16 which is preferably circular in shape, and which is only carried on side 18 of card 10. Pair 14 is also provided with another conductive pad 20 which has a cylindrical eyelet shape and which extends through a hole 22 in card 10. Thus pad 20 has a circular portion 20*a* on the side 18 of card 10, a circular portion 20*b* on the side 24 of card 10, and a cylindrical interconnecting portion 20*c* which passes through hole 22 to provide an electrically conductive path from side 18 to side 24 of card 10. Pads 16 and 20 are electrically connected by conductive path 26.

Each pair of pads 16 and 20 are normally electrically isolated from each other pair 14. Conductive paths 28 are provided to interconnect selected pairs 14 with the leads of a component (not shown) mounted on portion 12 of card 10. In this manner, separate conductive paths are provided for each component lead.

Pads 16 and 20 and conductive paths 26 and 28 may be formed on card 10 by any well-known technique, such as printing, etching, plating, vacuum deposit or the like. A preferable technique for forming the pads and conductive paths is etching. In such case, card 10 would be provided with conductive foil, such as copper, on either side thereof. A resist pattern corresponding to the desired pad and conductive path configuration is then formed on both sides of the card, and unwanted copper foil etched away by means of suitable etching solution. The resist would then be removed and the card cleaned, leaving the desired configuration. The card may then be subjected to a plating process to interconnect circular pad portions 20*a* and 20*b* of pad 20.

The component card 10 shown in FIG. 2 differs from the component card shown in FIG. 1 only in the location of portion 12. Due to space limitations, it is desirable that adjacent component cards have staggered portions 12, so that the components mounted on cards 10 will not interfere with one another.

Figures 4, 5:
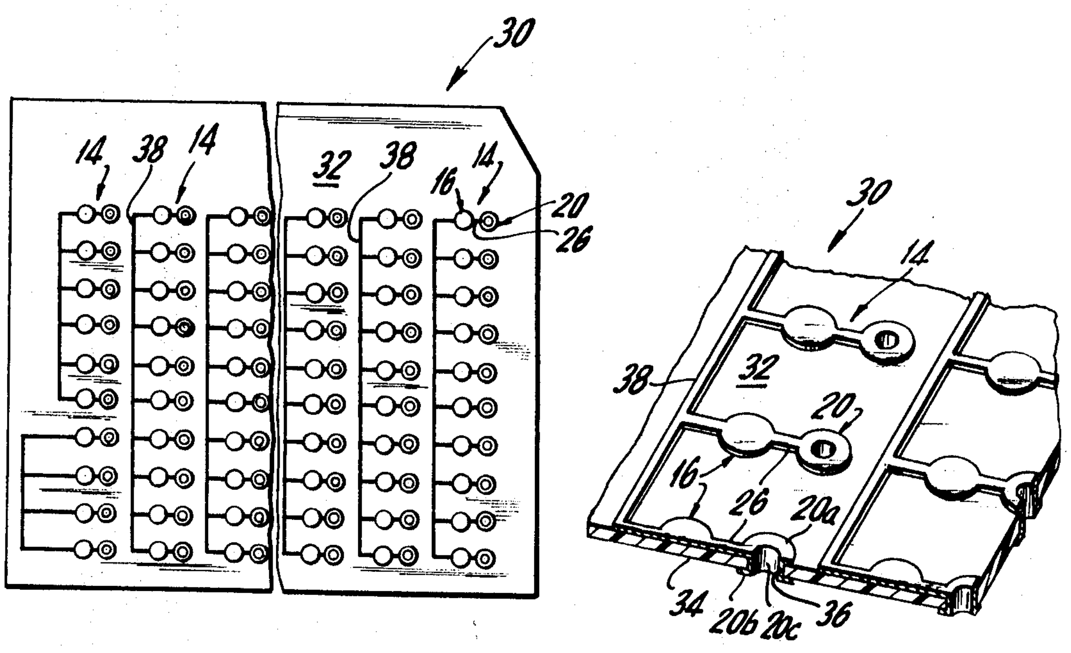
FIGS. 4 and 6 are plan views respectively of preferred vertical and horizontal wiring cards which may be used in the system of the present invention.
FIGS. 5 and 7 are partially sectional perspective views of the cards respectively of FIGS. 4 and 6.

Referring now to FIGS. 4–7, there are shown preferred embodiments of the vertical and horizontal wiring cards, which may be used in the system of the present invention. In FIGS. 4 and 5, there is shown a vertical wiring card 30 having a matrix of pad pairs 14, each pair comprising a pad 16 and a plated through pad 20 electrically interconnected by means of conductive path 26. As described hereinabove with respect to component card 10, pad 20 comprises a circular portion 20*a* on side 32 of card 30, a circular portion 20*b* on side 34 of card 30, and an interconnecting cylindrical portion 20*c* passing through hole 36 in card 30. It will be noted that, whereas in card 10 the plated through pad 20 of pair 14 was the left-hand pad of the pair, in card 30 the plated through pad 20 is the right-hand pad of the pair 14. The reason for such difference will be explained in greater detail hereinafter.

As shown in FIG. 4, all of the pairs 14 in a vertical column are preferably electrically interconnected by means of conductive paths 38. However, as shown in the first column on the left, two groups of pairs 14 are separately interconnected. Other interconnection configurations in a vertical direction may also be made.

Figure 6:
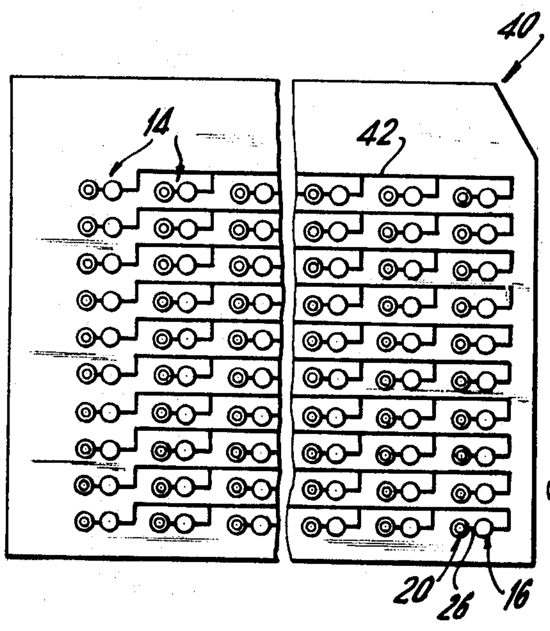
Figure 7:
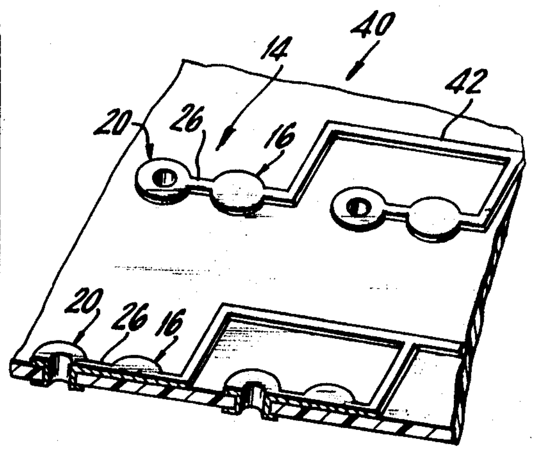

Referring now to FIGS. 6 and 7, a horizontal wiring card 40 is shown. As with cards 10 and 30, there is provided a matrix of conductive pad pairs 14, each pair comprising a pad 16 and a plated through pad 20 electrically interconnected by a conductive path 26. In contrast to vertical card 30, however, horizontal card 40 is provided with conductive paths 42 for electrically interconnecting all of the pad pairs 14 in a horizontal row. In horizontal card 40, the plated through pad 20 is the left-hand pad of each pair 14. The reasons for alternating conductive pads 20 from left to right within a given pair 14 for cards 10, 30 and 40 will now be explained. In providing electrical interconnection between two component cards 10, 2 vertical cards 30 and one horizontal card 40 are preferably utilized. The cards are sandwiched together in the following sequence: a component card, a vertical card, a horizontal card, a vertical card, and a component card. In this sequence, a plated through pad 20 on one card will be in electrical contact with a surface pad 16. This is accomplished by alternating the position of pads 16 and 20 on cards which are adapted to be adjacent each other. Through the particular structure of cards 10, 30 and 40, electrical current may be either conducted between cards or along a horizontal or vertical path on the surface of wiring cards 30 and 40.

In order to provide discrete electrical paths between the leads of components mounted on two contiguous component cards, some means must be provided to electrically isolate these paths. According to the present system, this is accomplished by interrupting the electrical interconnection either between electrically connected pairs, or individual pads of a pair on wiring cards 30 and 40. Since cards 30 and 40 are preferably the size of standard business machine cards, standard key punch machines may be used to perforate cards 30 and 40, according to a predetermined pattern, in order to electrically isolate conductive portions of wiring cards 30 and 40.

Figures 8, 9:
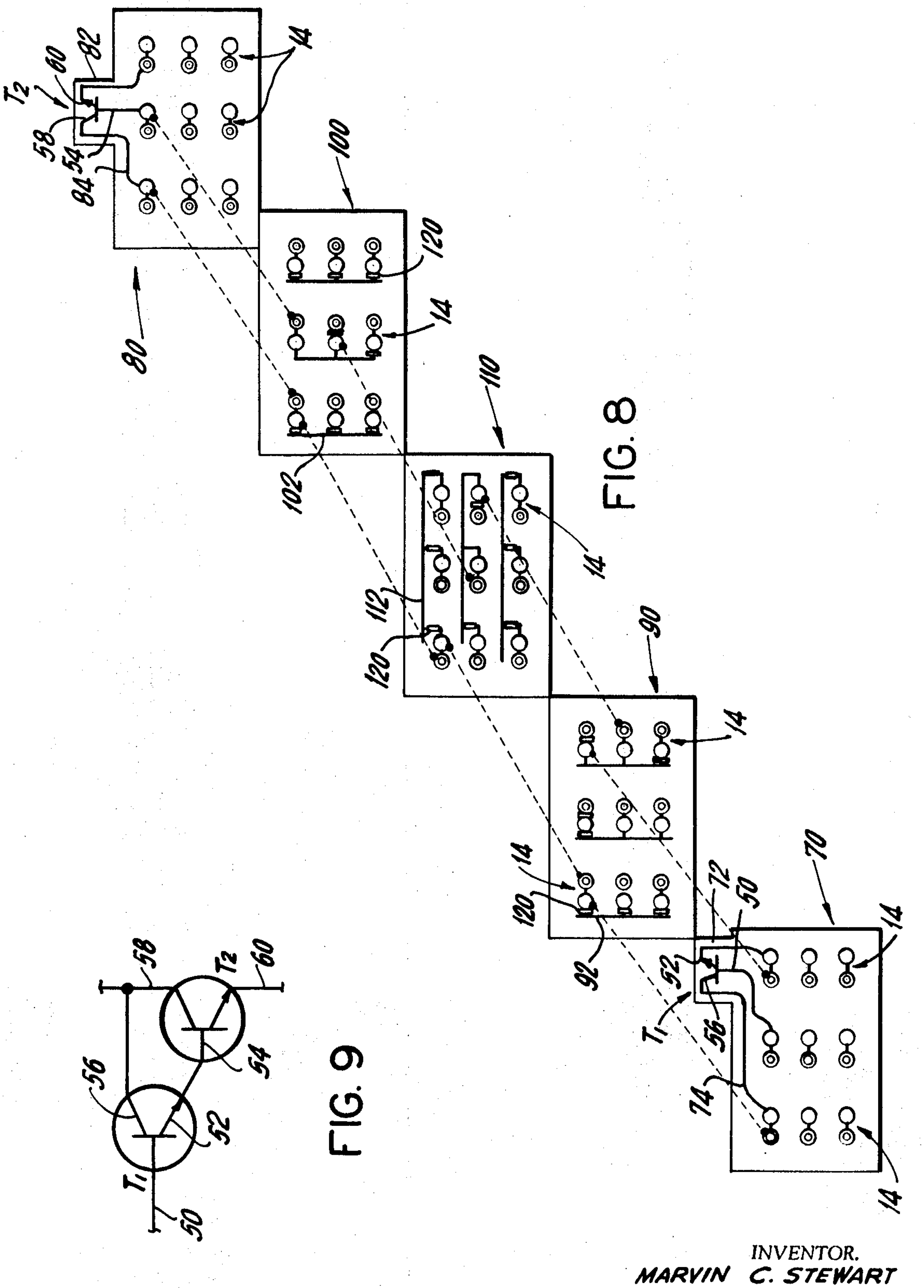
FIG. 8 is a simplified schematic exploded view of a system for interconnecting two resistors arranged in the circuit schematically shown in FIG. 9.

Referring now to FIGS. 8 and 9, there is shown in schematic form a typical circuit configuration utilizing the system of the present invention. FIG. 9 schematically shows a pair of transistors which are electrically interconnected in a "Darlington" circuit. In this circuit, the base 50 of transistor $T_1$ comprises the input to the circuit. The emitter 52 of $T_1$ and the base 54 of transistor $T_2$ are commonly connected as are the collector 56 of $T_1$ and the collector 58 of $T_2$. The emitter 60 of $T_2$ would normally be connected to ground, and collectors 56 and 58 would be connected to a load.

FIG. 8 shows how transistors $T_1$ and $T_2$ are interconnected utilizing the system of the present invention. As shown, transistor $T_1$ is mounted on the protruding portion 72 of component card 70. Card 70 is shown as having a matrix of three rows and three columns of pairs of conductive pads 14. Each pair 14 is shown as being electrically isolated from each other pair. The collector base and emitter of $T_1$ are respectively electrically connected by conductive paths 74 to the first, second and third pairs from the left of the first row of pairs 14 on card 70. The collector, base and emitter of $T_2$ are respectively electrically connected by conductive paths 84 to the first, second and third pairs from the left of the first row of pairs 14 on card 80.

Electrical connection between cards 70 and 80 is accomplished through vertical wiring cards 90 and 100, and horizontal wiring card 110 positioned in between cards 90 and 100. As described hereinabove, vertical wiring cards 90 and 100 have all the pad pairs 14 in a vertical row interconnected by means of conductive paths, in this case, paths 92 on card 90 and paths 102 on card 100. As also described hereinabove, all of the pad pairs 14 in a horizontal row on a horizontal wiring card, such as card 110, are electrically interconnected by conductive paths, such a paths 112.

It will be noted that, in this preferred embodiment, each matrix of pad pairs 14 on cards 70, 80, 90, 100 and 110 are in alignment when the cards are sandwiched together to form engaging contact between adjacent cards. It will also be noted that the relative position of the surface pad and the plated through pad of each pair is alternated between adjacent cards. In this manner, when the cards are in engaging contact, a plated through pad on one card will be in electrical contact with a surface pad on the next adjacent card. With this arrangement, by appropriately interrupting the conductive paths either between pairs or from one pair to another pair, an electrical path may be established either through the card from one card to the next, or along the surface of the card. For example, if the electrical connection on one of the wiring cards is interrupted between a pair and the conductive path connecting that pair with other pairs in a row or column, then the electrical path will be through the card to the next adjacent card. On the other hand, if the electrical path between pads in a pair is interrupted while the path between the pair and other pairs is uninterrupted, an electrical path will be established along the surface of the card until some pair is reached which permits conduction through the card. It will be seen that by appropriately interrupting the electrical connection either between pads of a given pair 14, or between individual pairs on a wiring card, that separate electrical paths may be established from one card to the next.

This will be understood more clearly by tracing the individual electrical paths between transistor $T_1$ and $T_2$ mounted respectively on cards 70 and 80. As pointed out above, base 50 of transistor $T_1$ is the input to the circuit schematically shown in FIG. 9, and therefore no electrical connection should be made between card 70 and card 80. In order to achieve this, electrical connection between the first pad pair 14 in column 2 of card 90 is electrically cut off from connecting conductive path 92 by punching a hole in the conductive path electrically connecting the pad pair to conductive path 92. The individual pads of this pair are also electrically cut off from one another by punching a hole in the conductive path connecting them. In this manner, although there is electrical contact between the corresponding pad pair 14 on card 70 with the above-mentioned pad pair on card 90, no electrical conduction will take place either along the surface of card 90, or from card 90 to card 110.

In similar manner, electrical connection is made between collector 56 of $T_1$ mounted on card 70, and collector 58 of $T_2$ mounted on card 80 by suitably punching holes 120 in cards 90, 100 and 110 to establish an electrical path shown in dashed lines on the left-hand side of FIG. 8. In similar manner, an electrical path is established between emitter 52 of $T_1$ and base 54 of $T_2$ by punching suitable holes in wiring cards 90, 100, and 110 to establish the path as shown in dashed lines to the right of FIG. 8. Taking this path as an example, the electrical path is as follows: from emitter lead 52 of $T_1$, the path continues along conductive path 74 on card 70 to the first pad pair 14 in the third column of card 70. Electrical contact is established between the plated through pad of this pair to the surface pad of the first pair 14 in column 3 of card 90. Since holes have been punched to isolate this pad from its plated through pad and from the third pair 14 in column 3 of card 90, an electrical path is established from the surface pad through conductive path 92 to the second pair of column 3 of card 90. Since the plated through hole of this pad is in contact with the surface pad of the second pad pair of the third column of card 110, the electrical path is continued through card 90 to card 110. Suitable holes punched in cards 110 and 100 complete the electrical path to the first pad pair 14 in the second column of card 80, thence to base 54 of $T_2$.

It is thus seen that through the juxtaposition of vertical and horizontal wiring cards between component cards, and through the proper punching of holes in these cards to interrupt conductive paths thereon, that separate electrical paths may be established between component cards. It will be understood that, although certain matrix is shown and described hereinabove, any matrix of pad pairs may be provided, and the electrical interconnection between pad pairs on the wiring cards may also be in any suitable predetermined configuration. However, for standardization and efficiency, it has been found that the use of two types of wiring cards, namely horizontal-type wiring card and vertical-type wiring card, provides the best and most economical means for interconnecting components mounted on component cards.

Although it is preferable that the sequence of stacked cards be component card, vertical card, horizontal card, vertical card component, it will be understood that the sequence could also be component card, horizontal card, vertical card, horizontal card, component card, and still be considered to be within the present invention. In such a case, it is only necessary that alternately adjacent cards have pad pairs which alternate the surface pad and the plated through pad.

It will also be understood that any size and/or shape of component or wiring cards may be used, and still be considered within the scope of the present invention. It is only necessary that each card carry a plurality of pad pairs, one of the pads of each pair being plated through to the other side of the card, and the other pad of each pair forming a surface pad, and that some of the pairs on adjacent cards be in alignment with the two types of pads being alternated from one card to the next.

Thus it is seen that an interconnection system for electrical components is provided which is compact, permits economical and rapid assembly, and permits the use of automated equipment for assembly, including standard business machines. It has been found that the system of the present invention counteracts "skin effect" in high frequency signals, and that inductive pickup is reduced, since current flow between adjacent cards is at right angles. In addition, the contact resistance from card to card is low, and the effective length of the conductive path is kept to a minimum. In addition, the transient response is independent of the number of cards used and has been found to be substantially equal to the transient effect of a single card. The conductive paths are hidden and protected, and oxidation is inhibited since the cards are compressed together, providing an airtight bond at contacts. At the same time, the wiring may be varied by replacing wiring cards with different wiring cards. The component cards may be reused, since no holes are punched therein. Thus the system of the present invention is highly flexible, and permits a user thereof to establish any change in his electrical equipment without substantial modification thereof. The expense in wiring and connector systems used in printed circuit modules is substantially eliminated through the use of cards having pads which provide electrical contact between cards through direct engagement between the pads. Because the cards are pressed firmly together to make electrical contact, there is no rubbing, and expensive wear-resistant materials such as nickel and rhodium are not required for the pad pairs.

Although specific embodiments of the system of the present invention have been shown in the drawings and described hereinabove, it will be understood that modifications and other embodiments evident to those skilled in the art are considered to be within the scope of the present invention.

What is claimed is:

1. An electrical interconnection system comprising at least first and second members of insulating material, each of said members carrying a plurality of pairs of pads of conductive material, the pads within each pad pair being electrically interconnected, one pad of each of said pad pairs being carried on one side of said members and only not extending through to the other side of said members, and the other pad of each said pad pairs extending through a hole in said member carrying said pad and having a conductive portion on each side of said member, at least some of said one pads carried by said second member being in alignment with corresponding other pads carried by said first member when said members are in engagement such as to establish electrical connection between said members.

2. The electrical interconnection system of claim 1 including means for electrically interconnecting some of said pad pairs of at least one of said members, such that when said members are in engagement, at least one conductive path is established along the plane of said at least one member and to said other of said members.

3. The electrical interconnection system of claim 1 including means for electrically interconnecting some of said pad pairs on each of said members, such that when said members are in engagement, at least one conductive path is established along the plane of each of said members and between said members.

4. The electrical interconnection system of claim 1 wherein said pad pairs on each of said members are arranged according to a predetermined configuration, the pad pair configurations on each of said members being substantially similar and in general alignment when said members are brought into contact engagement.

5. An electrical interconnection system comprising at least first and second members of insulating material, each of said members carrying a plurality of pairs of pads of conductive material, the pads within each pair being electrically interconnected, said pad pairs carried by each of said members being arranged in a matrix of vertical columns and horizontal rows, said matrices being in general alignment when said cards are brought into contacting engagement, one pad of each of said pairs being carried on one side of said cards and only not extending through to the other side of said cards, and the other pad of each said pairs extending through a hole in said card carrying said pad and having a conductive portion on each side of said card, the position of said one and other pads in each pair being alternated in said second card from the position in said first card, such that when said cards are in engagement, electrical contact is made between said members.

6. The system of claim 5 wherein at least some of said pad pairs on one of said members are electrically interconnected in such manner that when said members are in engagement, at least one conductive path is established along the plane of said at least one member and to said other of said members.

7. The system of claim 5 including means for electrically interconnecting some of said pad pairs on each of said members, such that when said members are in engagement, at least one conductive path is established along the plane of each of said members and between said members.

8. An electrical interconnection system comprising at least first and second cards of insulating material, each of said cards carrying a plurality of pairs of pads of conductive material, first conductive means for electrically connecting said pads in each of said pairs, said pad pairs carried by each of said cards being arranged in a matrix of vertical columns and horizontal rows, said matrices being in general alignment when said cards are brought into contacting engagement, one pad of each of said pairs being carried on one side of said cards and only not extending through to the other side of said cards, and the other pad of each said pairs extending through a hole in said card carrying said pad and having a conductive portion on each side of said card, the position of said one and other pads in each pair being alternated in said second card from the position in said first card, such that when said cards are in engagement, said other pads on said first card will be in contact with said one pads on said second card, second conductive means for electrically interconnecting all of the pairs in each vertical row on said first card and third conductive means for electrically interconnecting all of the pairs in each horizontal row in said second card.

9. An electrical interconnection system comprising at least first and second cards of insulating material, each of said cards carrying a plurality of pairs of pads of conductive material, first conductive means for electrically connecting said pads in each of said pairs, said pad pairs carried by each of said cards being arranged in a matrix of vertical columns and horizontal rows, said matrices being in general alignment when said cards are brought into contacting engagement, one pad of each of said pairs being carried on one side of said cards and only not extending through to the other side of said cards, and the other pad of each said pairs extending through a hole in said card carrying said pad and having a conductive portion on each side of said card, the position of said one and other pads in each pair being alternated in said second card from the position in said first card, such that when said cards are in engagement, said other pads on said first card will be in contact with said one pads on said second card, second conductive means for electrically interconnecting all of the pairs in each vertical row on said first card, third conductive means for electrically interconnecting all of the pairs in each horizontal row in said second card, means for interrupting the electrical connection between selected pairs in the pair columns of said first card and in the pair rows in said second card and between pads of selected pairs in each of said cards in order to form at least one conductive path between said cards when they are in engagement.

10. The system of claim 9 wherein said interrupting means comprises selected holes punched in said first, second and third conductive means to electrically isolate some of said pairs and some of said pads within selected pairs to form said at least one conductive path.

11. A card for use in an electrical interconnection system comprising a substantially rectangular card of insulating material, said card carrying a plurality of pairs of pads of conductive material, said pad pairs carried by each of said cards being arranged in a matrix of vertical columns and horizontal rows, one pad of each of said pairs being carried on one side of said card and only not extending through to the other side of said card, and the other pad of each said pairs extending through a hole in said card carrying said pad and having a conductive portion on each side of said card.

12. The card of claim 11 wherein at least some of the pad pairs in at least some of said vertical columns of pad pairs are vertically electrically interconnected.

13. The card of claim 11 wherein each of the pad pairs in some of said vertical columns of pad pairs are vertically electrically interconnected.

14. The card of claim 11 wherein at least some of the pad pairs in at least some of said horizontal rows of said pad pairs are horizontally electrically interconnected.

15. The card of claim 11 wherein each of the pad pairs in some of said horizontal rows of pad pairs are horizontally electrically interconnected.

16. The card of claim 11 wherein said card is provided with a projecting portion along one edge thereof, said projecting portion adapted to mount an electrical component and including at least one conductive path extending from said projecting portion to at least one of said pad pairs and being electrically connected thereto.

17. The card of claim 11 wherein said card is provided with a projecting portion along one edge thereof, said projecting portion adapted to mount an electrical component and including a plurality of conducive paths extending from said projecting portion to a plurality of pad pairs, each of said conductive paths being electrically connected to one of said plurality of pad pairs.

UNITED STATES PATENT OFFICE
CERTIFICATE OF CORRECTION

Patent No. 3,605,063 Dated September 14, 1971

Inventor(s) Marvin C. Stewart

It is certified that error appears in the above-identified patent and that said Letters Patent are hereby corrected as shown below:

In "References Cited" - "6/1963" should be --6/1953--

In the "Abstract" - line 4 "EAch" should be --Each--

Col. 2, Line 37 - "resistors" should be --transistors--

Col. 4, Line 34 - "a" should be --as--

Col. 5, Line 23 after "second" and before "pair" insert --pad--

Signed and sealed this 7th day of March 1972.

(SEAL)
Attest:

EDWARD M.FLETCHER,JR.
Attesting Officer

ROBERT GOTTSCHALK
Commissioner of Patents